United States Patent
Chien

(10) Patent No.: US 7,171,183 B2
(45) Date of Patent: Jan. 30, 2007

(54) LINEARIZED FRACTIONAL-N SYNTHESIZER HAVING A CURRENT OFFSET CHARGE PUMP

(75) Inventor: Hung-Ming (Ed) Chien, Los Angeles, CA (US)

(73) Assignee: Broadcom Corporation, Irvine, CA (US)

(*) Notice: Subject to any disclaimer, the term of this patent is extended or adjusted under 35 U.S.C. 154(b) by 425 days.

(21) Appl. No.: 10/407,097

(22) Filed: Apr. 3, 2003

(65) Prior Publication Data

US 2004/0198290 A1 Oct. 7, 2004

(51) Int. Cl.
*H04B 7/00* (2006.01)

(52) U.S. Cl. ............... 455/260; 455/259; 455/258; 455/76; 331/17; 331/111; 331/147

(58) Field of Classification Search ......... 455/260, 455/259, 258, 257, 183.1
See application file for complete search history.

(56) References Cited

U.S. PATENT DOCUMENTS

| | | | | |
|---|---|---|---|---|
| 6,356,160 | B1* | 3/2002 | Robinson et al. | 331/17 |
| 6,407,643 | B2* | 6/2002 | Canard et al. | 331/16 |
| 6,456,831 | B1* | 9/2002 | Tada | 455/180.3 |
| 6,563,387 | B2* | 5/2003 | Hirano et al. | 331/11 |
| 6,759,838 | B2* | 7/2004 | Tao et al. | 324/76.53 |
| 6,856,794 | B1* | 2/2005 | Tso et al. | 455/260 |
| 6,900,700 | B2* | 5/2005 | Oosawa et al. | 331/46 |
| 6,906,596 | B2* | 6/2005 | Kitamura et al. | 331/36 C |

* cited by examiner

Primary Examiner—Quochien B. Vuong
Assistant Examiner—Richard Chan
(74) Attorney, Agent, or Firm—Garlick Harrison & Markison

(57) ABSTRACT

A linear fractional-N synthesizer includes phase and frequency detection module, a charge pump circuit, a loop filter, a voltage controlled oscillator, and a fractional-N divider. The phase and frequency detection module is operably coupled to produce a charge up signal, a charge down signal, or an off signal based on a phase difference and/or a frequency difference between a reference oscillation and a feedback oscillation. The charge pump circuit is operably coupled to produce a positive current when the charge up signal is received, a negative current when the charge down signal is received, and a non-zero offset current when the off signal is received. The charge pump includes a resistor and a control module. The resistor provides the non-zero offset current and the control module maintains the non-zero offset current at a substantially constant value. The loop filter is operably coupled to produce a control voltage based on at least some of: the positive current, the negative current, and the non-zero offset current. The voltage controlled oscillator produces an output oscillation based on the control voltage. The fractional-N divider module operably coupled to divided the output oscillation by a fractional N value to produce the feedback oscillation.

16 Claims, 12 Drawing Sheets local oscillation module 74 charge pump 102 &
loop filter 104 charge pump 102 &
loop filter 104

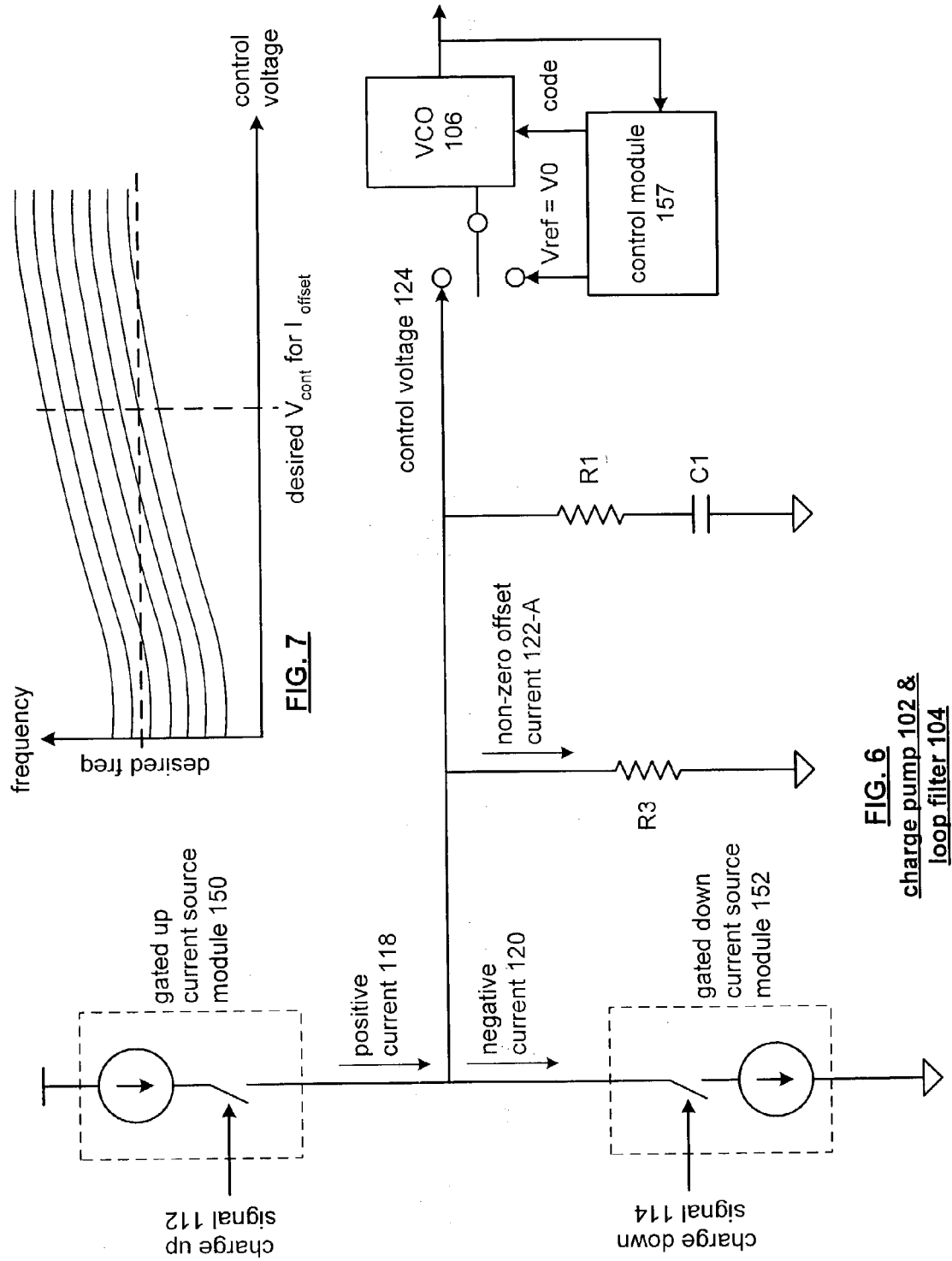

linearized fractional-N synthesizer 165 fractional N synthesizer 180 fractional N synthesizer 190 local oscillation module 74

LINEARIZED FRACTIONAL-N SYNTHESIZER HAVING A CURRENT OFFSET CHARGE PUMP

The present application claims priority under 35 U.S.C. § 120 to the following applications, each of which is incorporated herein for all purposes:

(1) LINEARIZED FRACTIONAL-N SYNTHESIZER HAVING A GATED OFFSET having an application Ser. No. of 10/170,849 and a filing date of Jun. 12, 2002; and (2) LINEARIZED FRACTIONAL-N SYNTHESIZER WITH FIXED CHARGE PUMP OFFSET having an application Ser. No. of 10/167,811 and a filing date of Jun. 12, 2002.

BACKGROUND OF THE INVENTION

1. Technical Field of the Invention

This invention relates generally to wireless communication systems and more particularly to radio frequency integrated circuits used in such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

The local oscillations used in both the transmitter and receiver may be produced by the same or different local oscillation generators. In either case, a local oscillator generator is typically implemented using a fractional N-synthesizer. As is known, a fractional N-synthesizer has a phase lock loop (PLL) topology that allows for fractional adjustments of the feedback oscillation via a feedback fractional N divider. As is also known, the fractional adjustments of the fractional N divider allow for fine tuning of the local oscillation such that, for example, a particular channel may be tuned, a particular intermediate frequency may be achieved, et cetera.

While a fractional-N synthesizer allows for fine-tuning of a local oscillation, its accuracy is limited by the linearity of the components comprising the fractional-N synthesizer. As is known, the fractional-N synthesizer includes a phase/frequency detector, a charge pump, a low pass or loop filter, a voltage control oscillator, and a fractional-N divider. In most fractional-N synthesizers, the charge pump is a tri-state device providing a positive current when the output oscillation is too low, a negative current when the output oscillation is too high and a zero current at all other times. Thus, when the output oscillation is at its desired rate, the charge pump is primarily providing zero current and, when needed, is providing a relatively small amount of positive current or negative current. To produce the relatively small amount of positive current, the charge pump enables a current source for a short period of time. To produce the relatively small amount of negative current, the charge pump enables a current sink for a short period of time.

Given the current state of the art of integrated circuit fabrication, it is impossible to get the properties (e.g., rise time, settling time, fall time, current magnitude, etc.) of the current source to exactly match the properties of the current sink. As a result of this mismatch, the charge pump does not provide a linear current response over the entire range of regulating the output oscillation. Further, in steady state conditions, the charge pump is primarily operating in the non-linear region due to the minimal amount of positive and negative current needed to maintain the output oscillation and, as a result, produces unwanted spurs in the output oscillation. Such spurs adversely affect the operation of any high performance device incorporating a fractional-N synthesis, including wireless communication devices.

Therefore, a need exists for a linearized oscillation synthesizer, including fractional-N synthesizers, and a method for linearizing an oscillation synthesis, including fractional-N synthesis that can be readily fabricated as part of an integrated circuit.

BRIEF SUMMARY OF THE INVENTION

The linearized fractional-N synthesizer having a current offset charge pump substantially meets these needs and others. An embodiment of a linear fractional-N synthesizer includes phase and frequency detection module, a charge pump circuit, a loop filter, a voltage controlled oscillator, and a fractional-N divider. The phase and frequency detection module is operably coupled to produce a charge up signal, a charge down signal, or an off signal based on at least one of a phase difference and a frequency difference between a reference oscillation and a feedback oscillation. The charge pump circuit is operably coupled to produce a positive current when the charge up signal is received, a negative current when the charge down signal is received, and a non-zero offset current when the off signal is received. The charge pump includes a resistor and a control module. The resistor provides the non-zero offset current and the control module maintains the non-zero offset current at a substantially constant value.

The loop filter is operably coupled to produce a control voltage based on at least some of: the positive current, the negative current, and the non-zero offset current. The voltage controlled oscillator produces an output oscillation based on the control voltage. The fractional-N divider module operably coupled to divided the output oscillation by a fractional N value to produce the feedback oscillation. With such a controlled offset current, an integrated circuit that includes a fractional-N synthesizer can be readily fabricated.

BRIEF DESCRIPTION OF THE SEVERAL VIEWS OF THE DRAWINGS

FIG. 6 is a schematic block diagram of another alternate charge pump and loop filter in accordance with the present invention;

FIG. 7 is a graph of selectable VCO curves in accordance with the present invention;

DETAILED DESCRIPTION OF THE INVENTION

Figure 1:
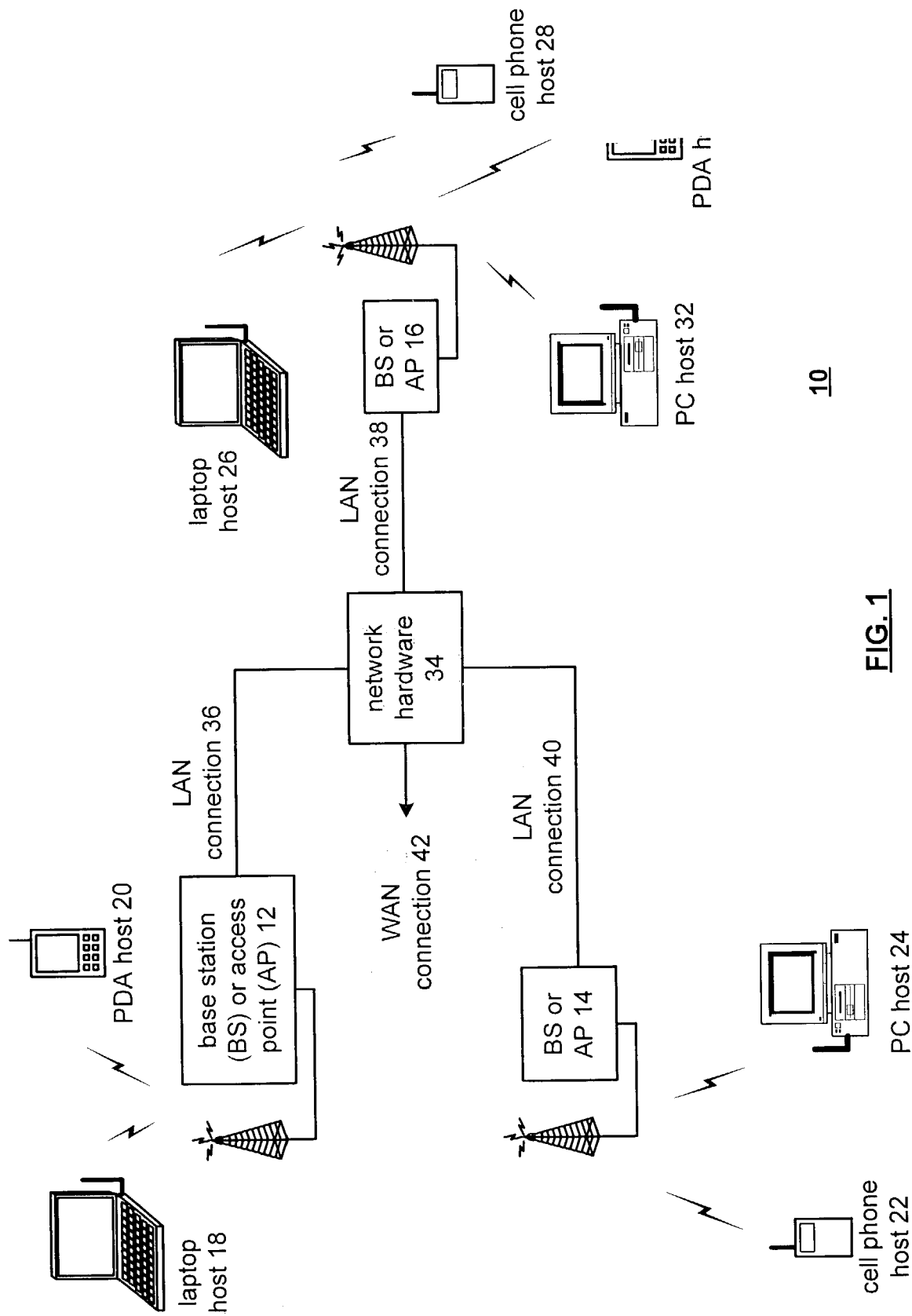
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
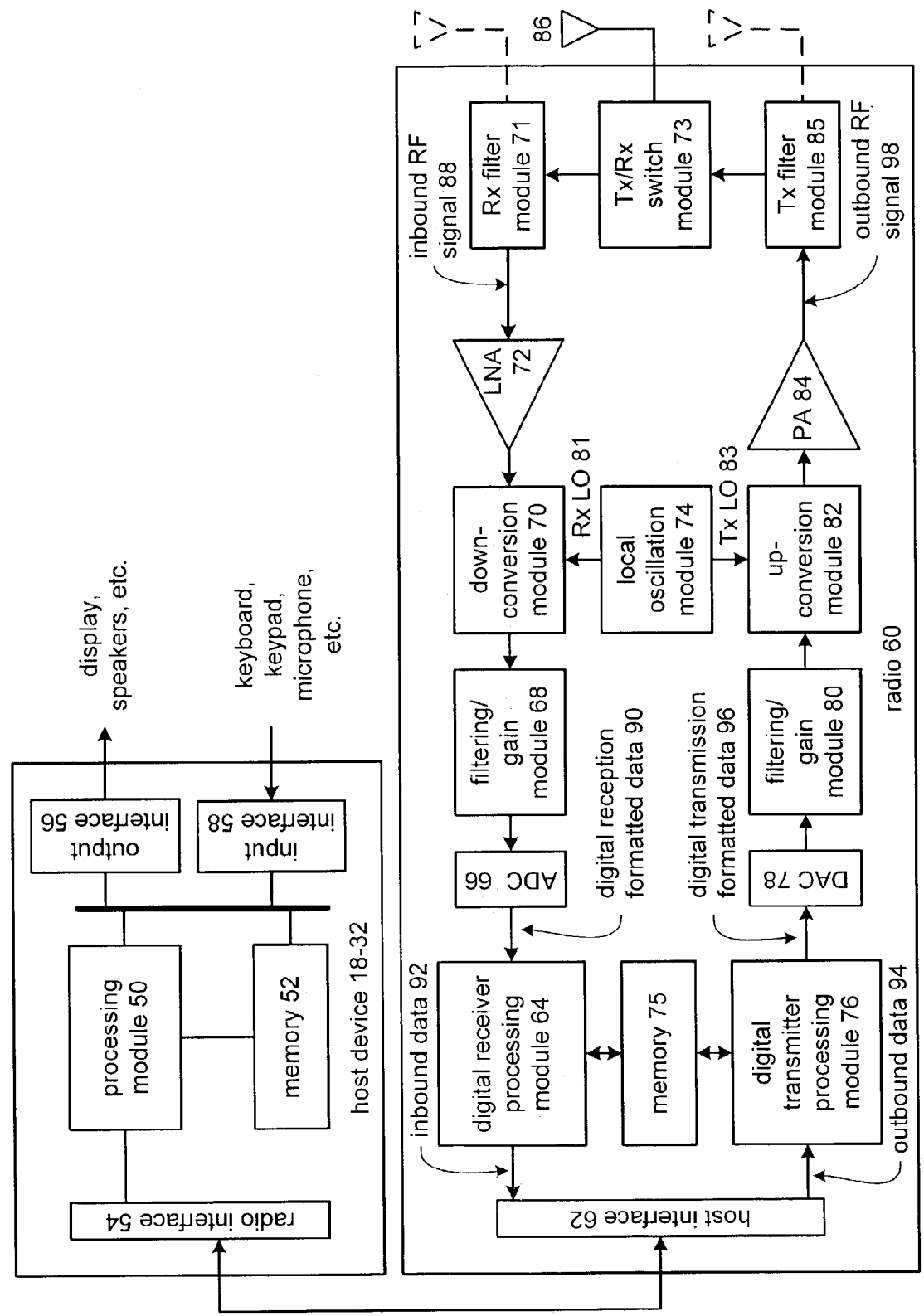
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
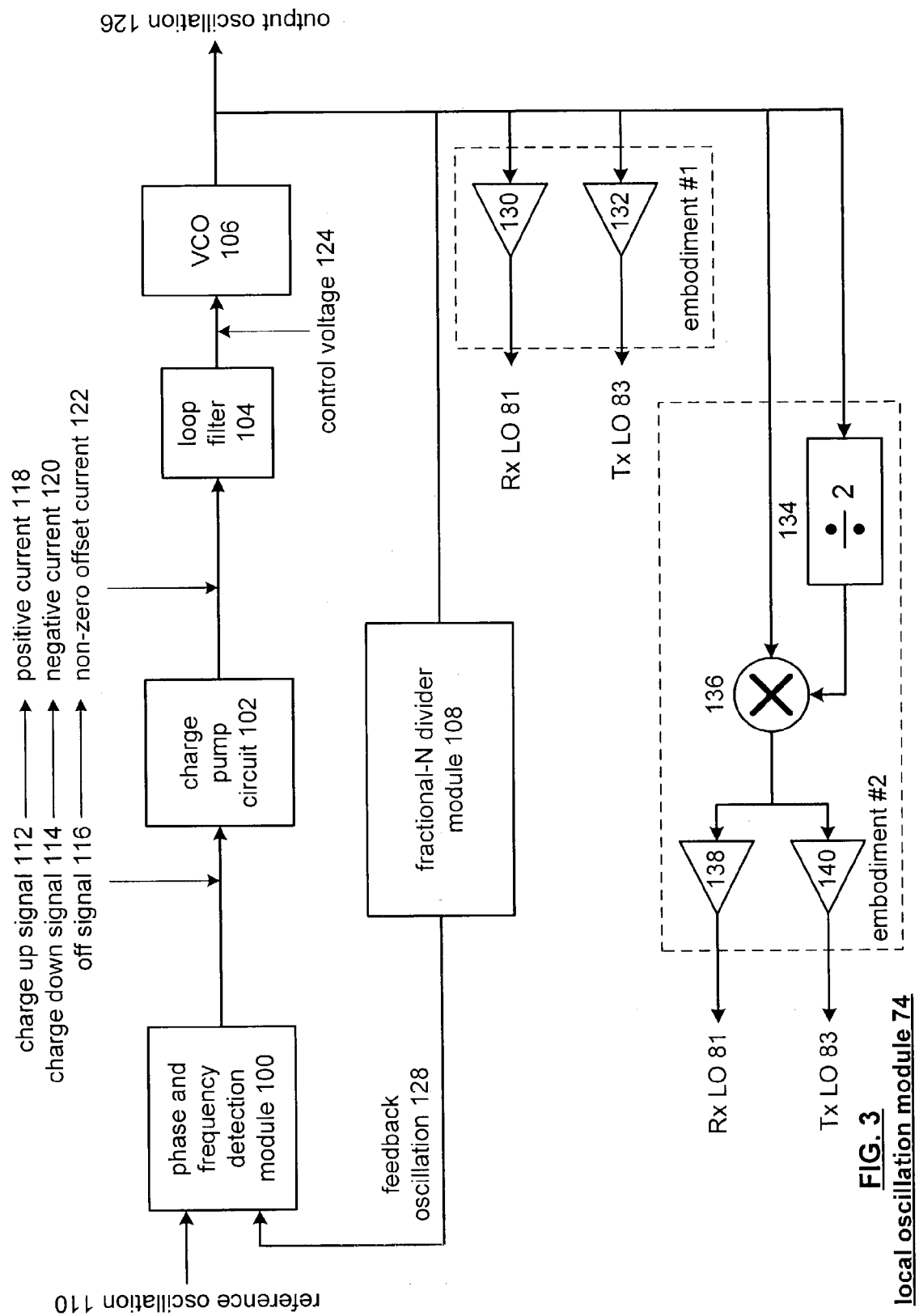
FIG. 3 is a schematic block diagram of a local oscillation module in accordance with the present invention.

FIG. 3 illustrates an embodiment of the local oscillation module 74 that includes a phase and frequency detection module 100, a charge pump circuit 102, a loop filter 104, a voltage controlled oscillator (VCO) 106, and a fractional-N divider module 108. The receiver local oscillation 81 and the transmitter local oscillation 83 may be generated from the output oscillation 128 in a variety of embodiments. In one embodiment, the receiver local oscillation 81 and the transmitter local oscillation 83 are directly produced from the output oscillation 126 via buffers 130 and 132. As one of average skill in the art will appreciate, an I and Q component for the receiver local oscillation 81 and the transmitter local oscillation 83 may be obtained by phase shifting the I components of the local oscillations 81 and 83 by 90°.

In an alternate embodiment, the receiver local oscillation 81 and transmitter local oscillation 83 may be produced by a plurality of logic gates. As shown, the output oscillation 126 may be divided via a divide by 2 module 134 and then multiplied via multiplier 136. The resulting oscillation from multiplier 136 has a frequency that is 1½ times the output oscillation 126. From this increased oscillation the receiver local oscillation 81 and transmitter local oscillation 83 are derived via buffers 138 and 140. As one of average skill in the art will appreciate, the output oscillation 126 may be phase shifted by 90° and the logic circuitry repeated to produce a Q component for the receiver local oscillation 81 and a Q component for the transmit local oscillation 83.

The phase and frequency detection module 100 is operably coupled to receive a reference oscillation 110 and a feedback oscillation 128. The reference oscillation 110 may be produced by a crystal oscillator and/or another type of clock source. The phase and frequency detection module 100 produces a charge-up signal 112 when the phase and/or frequency of the feedback oscillation 128 lags the phase and/or frequency of the reference oscillation 110. In this condition, the output oscillation 126 is at a frequency below its desired rate. The phase and frequency detection module 100 generates the charge down signal 114 when the phase and/or frequency of the feedback oscillation 128 leads the phase and/or frequency of the reference oscillation 110. In this condition, the output oscillation 126 is above its desired rate. The phase and frequency detection module 100 produces the off signal 116 when the phase and/or frequency of the feedback oscillation 128 is aligned with the phase and/or frequency of the reference oscillation 110. In addition, the phase and/or frequency detection module 100 produces the off signal 116 when not producing the charge-up signal or charge-down signal. This concept will be described in greater detail with reference to FIGS. 8 and 9.

The charge pump circuit 102, which will be described in greater detail in FIGS. 4–7, receives the charge-up signal 112, the charge-down signal 114 and the off signal 116. In response to the charge-up signal 112, the charge pump 102 produces a positive current 118, in response to the charge-down signal 114, the charge pump circuit 102 produces a negative current 120. Regardless of the charge-up signal 112, charge-down signal 114 or off signal 116, the charge pump 102 produces a non-zero offset current 122. Thus, when off signal 116 is present, the charge pump circuit 102 is producing the non-zero offset current 122. Further, when the charge pump circuit 102 produces the positive current 118 and the negative current 120 these currents are added to or subtracted from the non-zero offset current 122.

With the charge pump circuit 102 producing the non-zero offset current 122, the steady state condition of the local oscillation module 74, which may be implemented as a fractional-N synthesizer, is shifted from the non-linear region of the charge pump 102 into a linear region. With the charge pump operating in its linear region, the overall performance of the local oscillation module 74 is enhanced since the adverse spurs produced by non-linearities in the charge pump circuit 102 are substantially eliminated and noise is reduced.

The loop filter 104 receives the positive current 118, negative current 120 and non-zero offset current 122 and produces therefrom a control voltage 124. The loop filter 104 provides the control voltage 124 to the voltage control oscillator 106. The voltage control oscillator 106 generates the output oscillation 126 based on the control voltage 124.

The fractional-N divider module 108, divides the output oscillation 126 by a fractional-N divider value to produce the feedback oscillation 128. The fractional-N divider module 108 will be described in greater detail with reference to FIG. 10 but in general includes a Delta Sigma modulator, register and summing module. The Delta Sigma modulator is operably coupled to generate an over sampled digital data stream that represents a fractional component of the fractional-N value. The register stores an integer component of the fractional-N value while the summing module sums the over sampled digital data stream with the integer component to produce the fractional-N value. The Delta Sigma modulator may be a $3^{rd}$ order mash Delta Sigma modulator.

Figure 4:
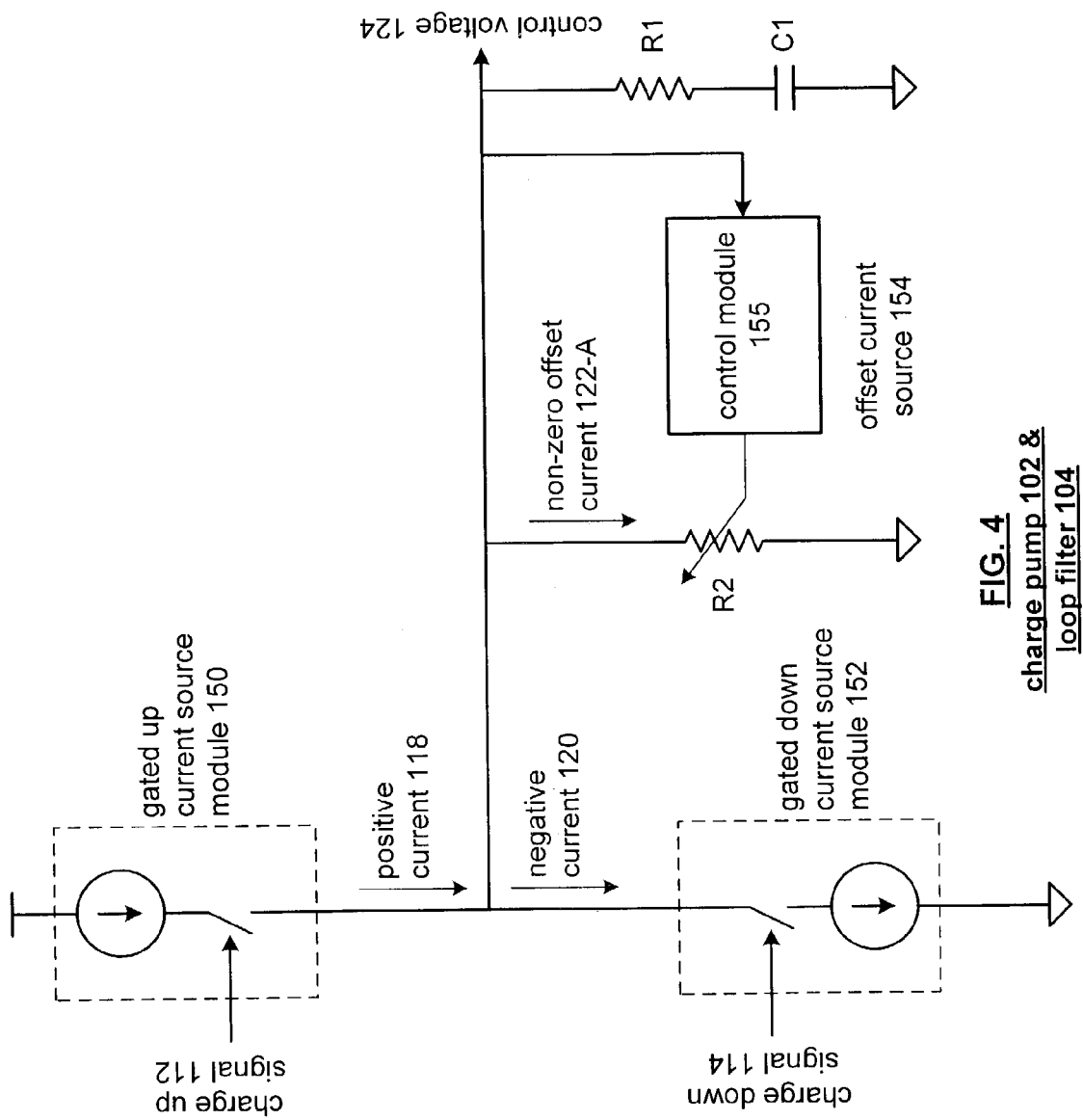
FIG. 4 is a schematic block diagram of a charge pump and loop filter in accordance with the present invention.

FIG. 4 illustrates a schematic block diagram of one embodiment of charge pump 102 and of loop filter 104. The loop filter 104 includes resistor R1 and capacitor C1. The remaining components, the gated-up current source module 150, the gated-down current source module 152 and the offset current source 154 comprise the charge pump 102. In this embodiment, the offset current source 154, which includes a resistor R2 and a control module 155, is constantly sinking a non-zero negative offset current 122-A from the loop filter. The non-zero negative offset current 122-A is a constant current and is generated regardless of whether the charge-up signal 112, the charge-down signal 114 or the off signal 116 is being generated. The control module 155 senses the control voltage 124 and adjusts resistor R2 to maintain a constant current through resistor R2. In particular, according to the linearity requirement for the charge pump, an offset duration could be chosen to fulfill the requirement. For a desired offset duration (ΔT), the resistance value for R2 is set to:

$$R = \frac{Vctrl(Fvco)}{Icp} * \frac{T}{\Delta T}$$

where Vctrl(Fvco) is the control voltage inputted to the VCO when the VCO is locked to Fvco, Icp is the charge pump current, and T is the period of the reference frequency. Due to the sources of Icp and T, these values are generally accurate. Vctrl(Fvco), however, is somewhat less accurate and varies due to process variations. As such, the control module 155 regulates the value of R, based on variations of Vctrl(Fvco) to maintain the offset current at a constant current value.

When the charge pump 102 receives the charge-up signal 112, the switch within the gated-up current source module 150 is closed thus, enabling the current source to provide positive current 118. Similarly, when the charge-down signal 114 is received, the switch in the gated-down current source module 152 is closed thus, allowing the associated current sink to provide the negative current 120.

Figure 5:
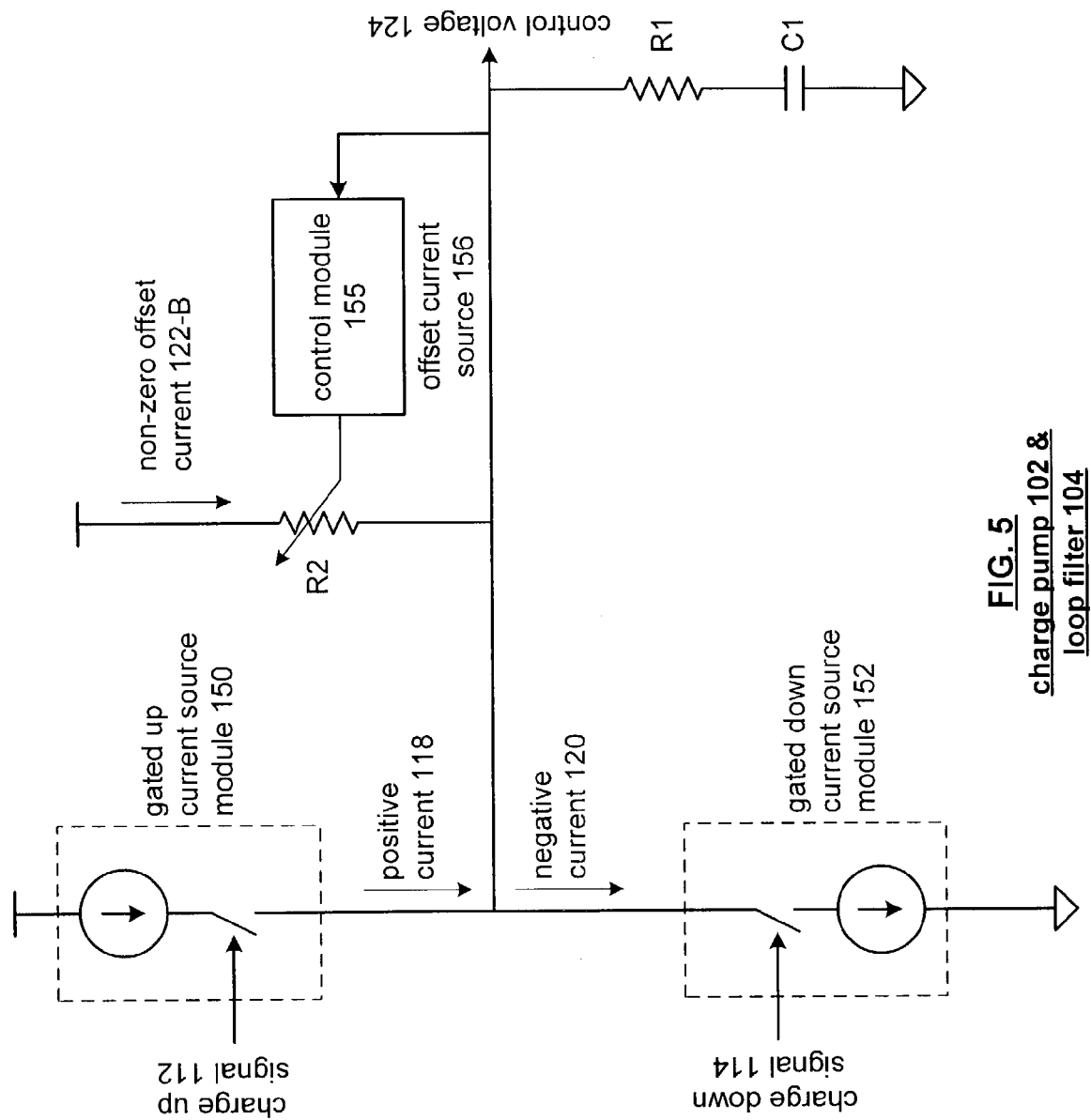
FIG. 5 is a schematic block diagram of an alternate charge pump and loop filter in accordance with the present invention.

FIG. 5 illustrates an alternate schematic block diagram of charge pump 102 and loop filter 104. Loop filter 104 again includes resistor R1 and C1. The charge pump 102 includes the gated-up current source module 150, the gated-down current source module 152 and offset current source 156. In this embodiment, the offset current source 156, which includes resistor R2 and control module 155, is continually providing a non-zero positive offset current 122-B. The gated-up current source module 150 and gated-down current source module 152 operate as previously discussed to produce the positive current 118 and the negative current 120.

As one of average skill in the art will appreciate, R2 of FIGS. 4 and/or 5 may be an on-chip calibrated resistor and/or an accurate off-chip resistor. Alternatively, an analog to digital converter (ADC) may be used to monitor the control voltage once the control voltage is substantially settled. The digital output of the ADC and resistor calibration information can be used to program the resistor R2.

FIG. 6 illustrates another schematic block diagram of charge pump 102 and loop filter 104. The loop filter 104 includes resistor R1 and capacitor C1. The charge pump 102 includes the gated up current source module 150, the gated down current source module 152, and resistor R3. Resistor R3 provides the non-zero offset current 122-A based on a substantially constant control voltage 124. To maintain the control voltage 124 at a substantially constant control voltage, the control module 157 adjusts the operating point of the VCO 106. This is illustrated in FIG. 7, where the desired control voltage 124 is set at a particular value and a different operating curve is selected to adjust the output frequency of the VCO 106.

In particular, the circuit of FIG. 6 may be calibrated such that the control voltage is fixed to a reference voltage (v0), which may correspond to a voltage produced by a bandgap reference. The control module 157, for calibration, includes a counter and control logic to search for a particular curve that generates the closest output oscillation to the desired output oscillation. Once the curve is identified, the VCO is biased, via the control module, to operate in accordance with the selected curve.

Figure 8:
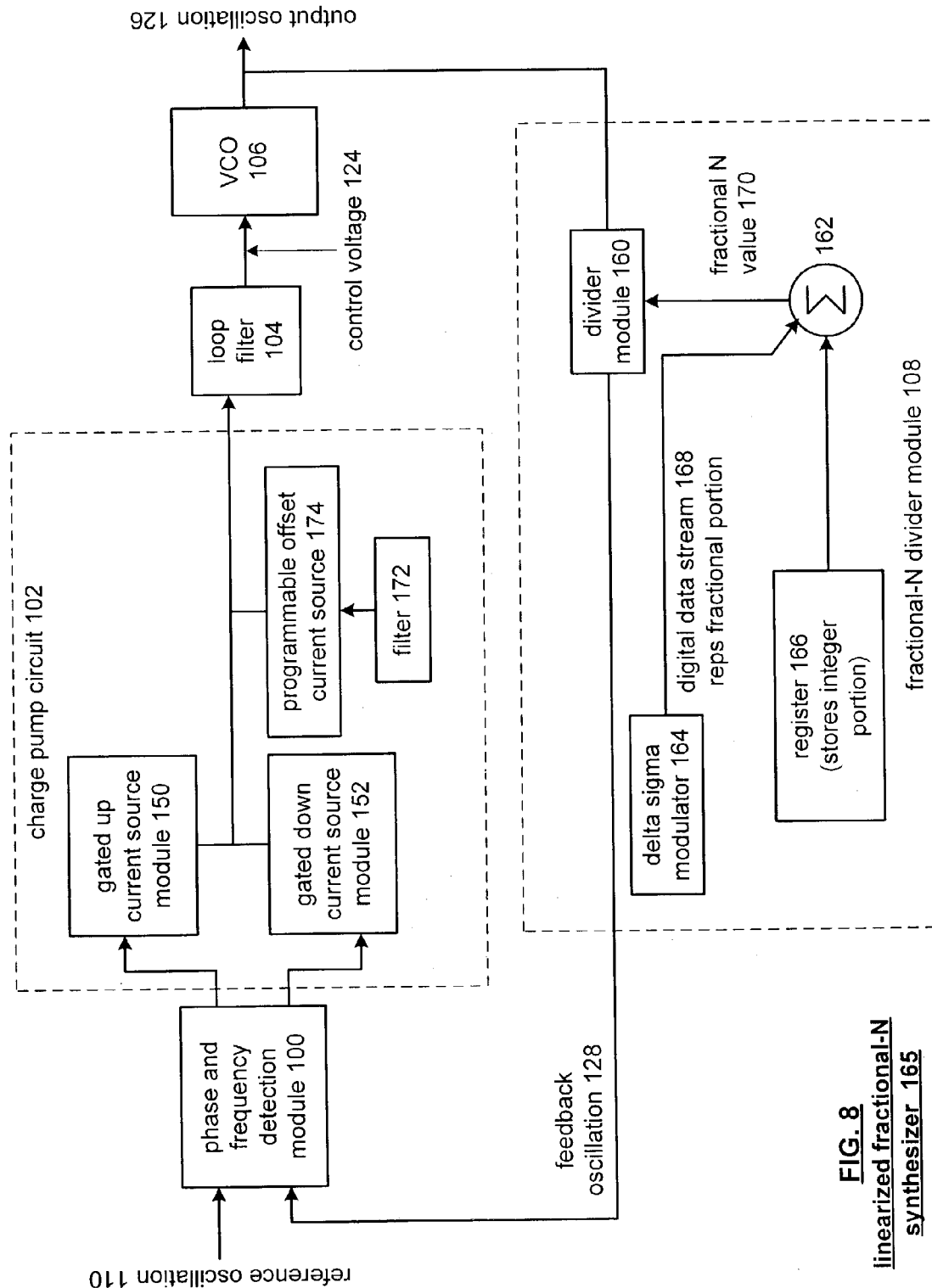
FIG. 8 is a schematic block diagram of a linearized fractional-N synthesizer in accordance with the present invention.

FIG. 8 illustrates a schematic block diagram of a linearized fractional-N synthesizer that may be used in the local oscillation module 74. The linearized fractional-N synthesizer includes the phase and frequency detection module 100, charge pump circuit 102, loop filter 104, VCO 106, and the fractional-N divider module 108. The charge pump circuit 102 includes a gated-up current source module 150, gated-down current source module 152, programmable offset current source 174 and filter 172. The fractional-N divider module 108 includes a divider module 160, a summing module 162, a Delta Sigma modulator 164 and a register 166.

The fractional-N divider module 108 functions to divide the output oscillation 126 by a fractional-N divider value 170 via the divider module 160, to produce the feedback oscillation 128. To produce the fractional-N divider value 170, register 166 stores the integer portion of the fractional-N divider value 170. To produce the fractional portion of the fractional-N divider value 170, the Delta Sigma modulator 164 is modulated based on the desired fractional value to produce a digital stream of data 168, which represents the fractional portion. The summing module 162 sums the integer portion with the digital data stream 168 to produce the fractional-N value 170. Divider module 160, based on the fractional-N divider value 170, produces the feedback oscillation 128 from the output oscillation 126.

The charge pump circuit 102 functions similarly to the charge pump circuits discussed with reference to FIGS. 4 and 5. In this embodiment, however, the offset current source is a programmable current source 174 that includes resistor R2 and control module 155 or 157 as shown in FIGS. 4–6, where resistor R2 is gated on and off. The corresponding offset current is based on a filtered representation of the digital data stream 168 via filter 172. By programming the offset current source based on the fractional portion, magnitude of reference oscillation spurs is reduced. As is known, fractional spurs are produced based on the reference oscillation times the fractional portion of the divider value and are different from the spurs produced by non-linearities of the charge pump. If the divider value is relatively small (e.g., 0.01) and the reference oscillation is 20 megahertz, the fractional spurs will be produced at + and −20 kilohertz with respect to the output oscillation 128. To minimize the magnitude of the fractional spurs, the offset current produced by the programmable offset current source 174 is of minimal value to shift the charge pump operation into the linear region but to minimize the magnitude of the reference spurs.

The performance of the phase and frequency detection module 100, loop filter 104 and voltage control oscillator 106 are as previously described. As one of average skill in the art will appreciate, the output oscillation 126 may be used to directly produce the transmit and receive local oscillations 81 and 83 or may be further processed by logic circuitry to produce the transmit and receive local oscillations 81 and 83.

Figure 9:
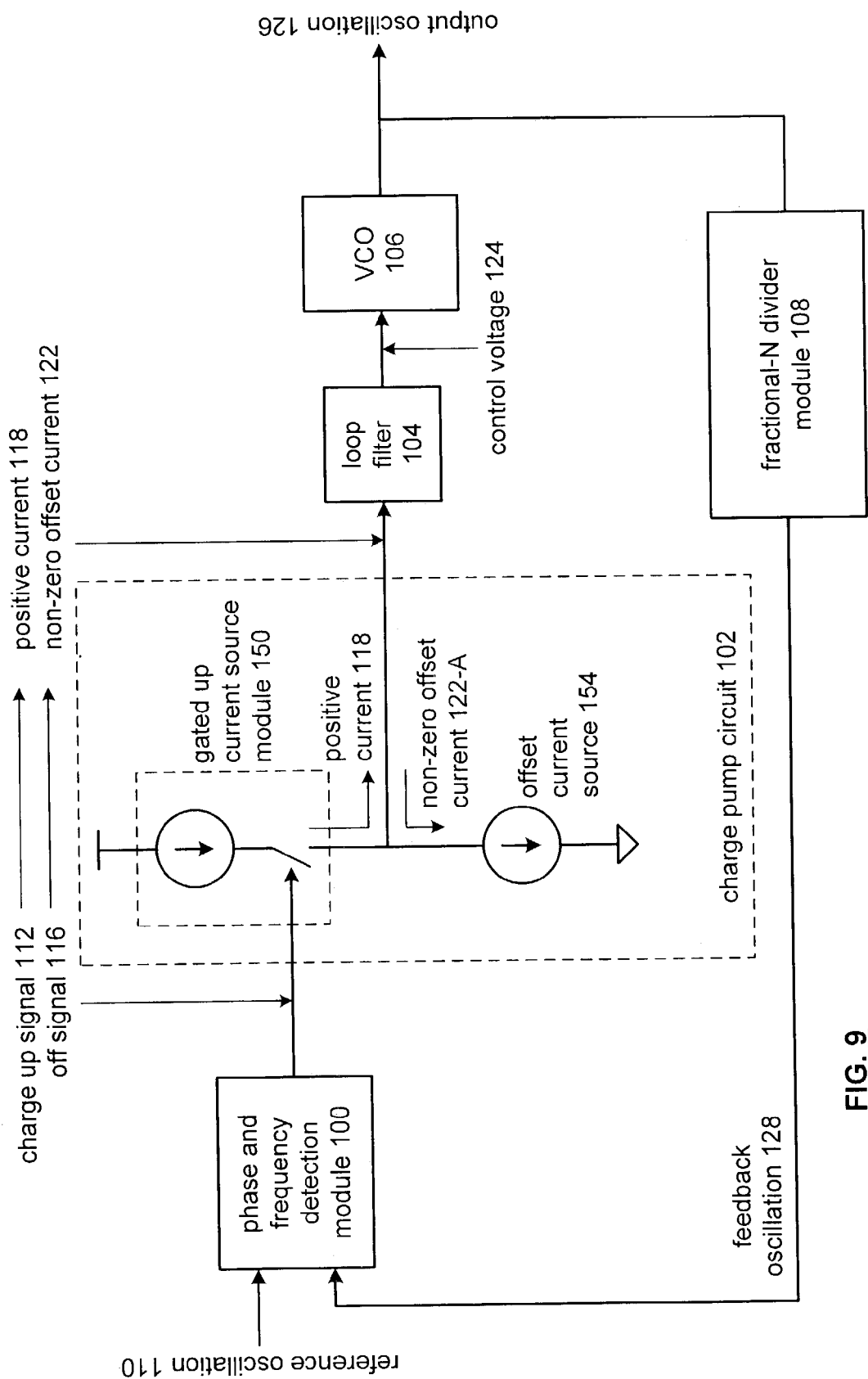
FIG. 9 is a schematic block diagram of an alternate linear fractional-N synthesizer in accordance with the present invention.

FIG. 9 illustrates an alternate schematic block diagram of a fractional-N synthesizer 180 that may be used in local oscillation module 74. In this embodiment of the fractional-N synthesizer 180, it includes the phase and frequency detection module 100, the charge pump current 102, loop filter 104, VCO 106 and fractional-N divider module 108. In this embodiment, the charge pump circuit 102 includes the gated-up current source module 150 and the offset current source 154, which may include resistor R2 and control module 155 or 157 as shown in FIGS. 4–6. With the addition of the offset current source 154, in steady state conditions, the phase and frequency detection module 100 will only produce the charge-up signal 112. As such, the charge pump circuit 102, in this embodiment, has omitted the gated-down current source module 152.

Figure 10:
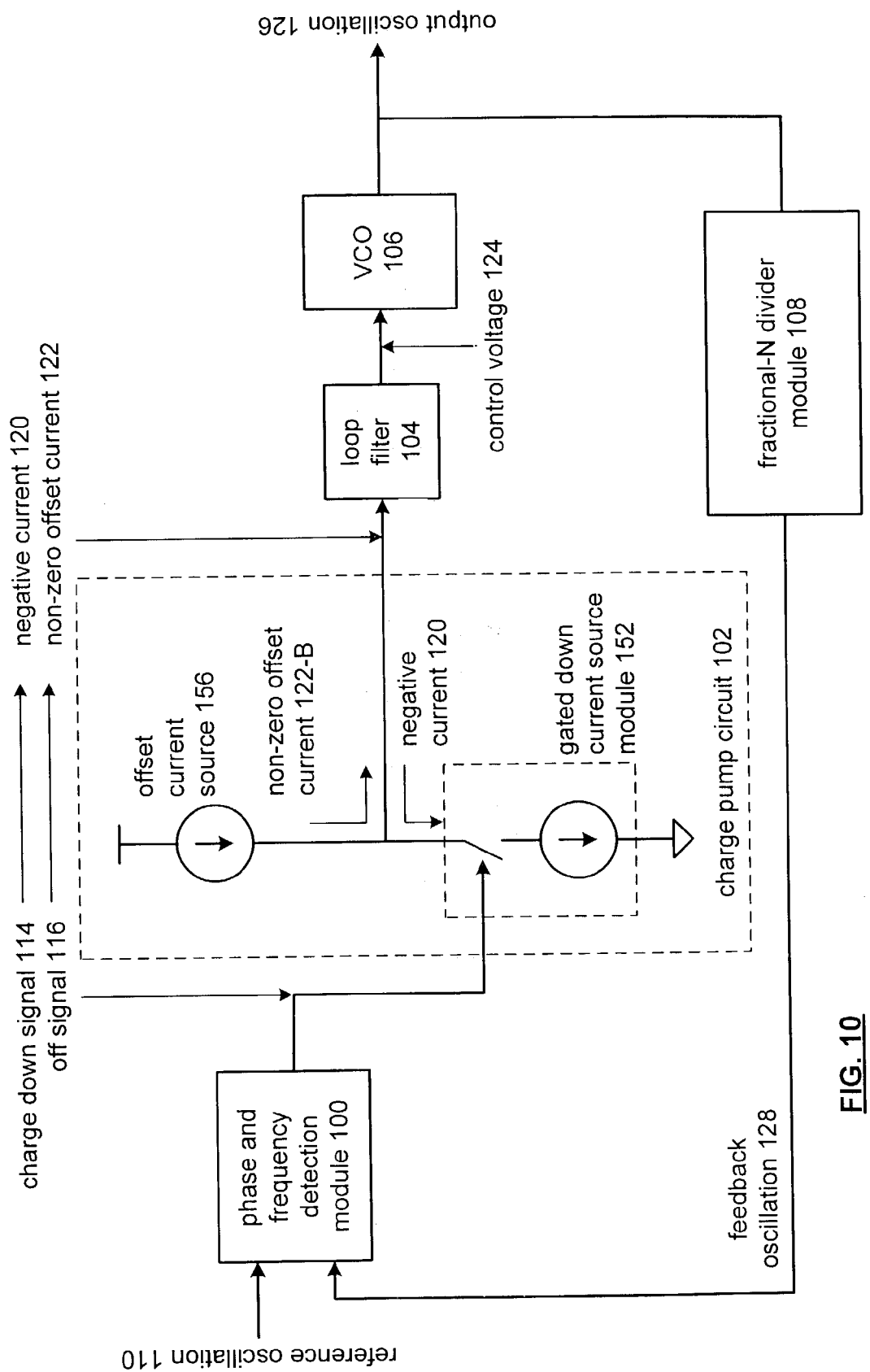
FIG. 10 is a schematic block diagram of another linearized fractional-N synthesizer in accordance with the present invention.

FIG. 10 illustrates an alternate schematic block diagram of a fractional-N synthesizer 190 that may be used in the local oscillation module 74. In this embodiment, the fractional-N synthesizer 190 includes the phase and frequency detection module 100, charge pump circuit 102, loop filter 104, VCO 106, and fractional-N divider module 108. In this embodiment, the charge pump circuit 102 includes the offset current source 156, which may include resistor R2 and control module 155 as shown in FIG. 5, that produces the non-zero offset current 122-B and the gated-down current source module 152. With the inclusion of the offset current source 156, the phase and frequency detection module 100 during steady state conditions will only produce a charge-down signal 114. As such, the gated-up current source module 150 may be omitted in this embodiment.

Figure 11:
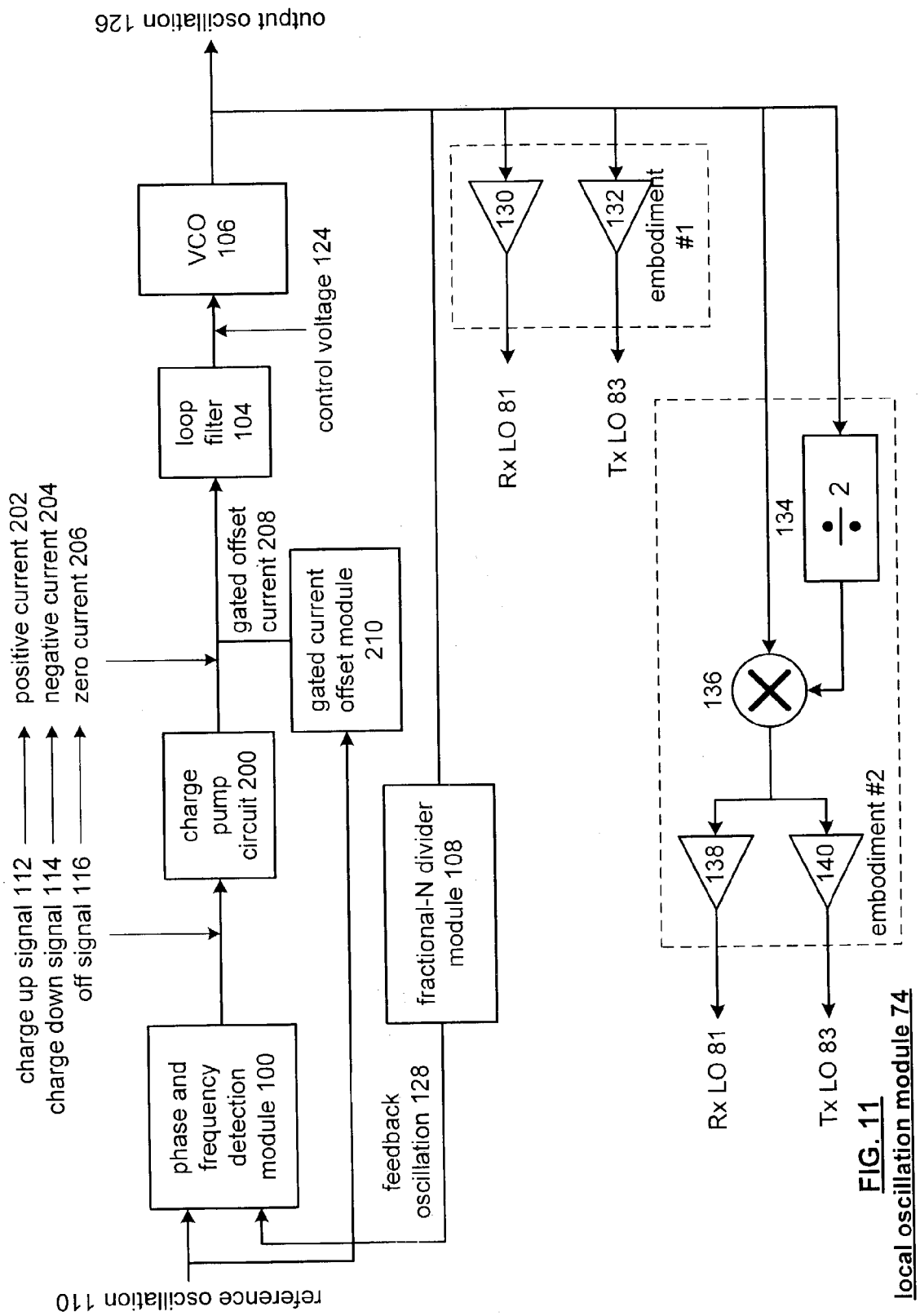
FIG. 11 is a schematic block diagram illustrating an alternate embodiment of a local oscillation module in accordance with the present invention.

FIG. 11 illustrates a schematic block diagram of local oscillation module 74 that includes the phase and frequency detection module 100, a charge pump circuit 200, a gated current offset module 210, loop filter 104, VCO 106, and fractional-N divider modules 108. The receiver local oscillation 81 and transmitter local oscillation 83 may be derived from the output oscillation 126 as shown in embodiments 1 or embodiments 2. Embodiments 1 and 2 were previously discussed with reference to FIG. 3.

In operation, the phase and frequency detection module 100 produces the charge-up signal 112, charge-down signal 114 and off signal 116 in response to phase and/or frequency differences between the reference oscillation 110 and feedback oscillation 128. The charge pump circuit 200 produces a positive current 202 in response to the charge-up signal 112, produces a negative current 204 in response to the charge-down signal 114, and produces a zero current 206 in response to the off signal 116.

The gated current offset module 20, which may include resistor R2 and control module 155 or 157 as shown in FIGS. 4, 5, or 6, provides a gated offset current 208 based on the reference oscillation 110. The current produced by the charge pump circuit 200 and gated offset current 208 are provided to loop filter 104, which produces therefrom the control voltage 124.

The gated current offset module 210 produces the gated offset current 208 to shift the response of the charge pump circuit as illustrated in FIG. 7. However, in comparison to the previously discussed charge pump circuits, which have a continual offset current, the offset current provided by the gated current offset module 210 is a non-continuous current.

Figure 12:
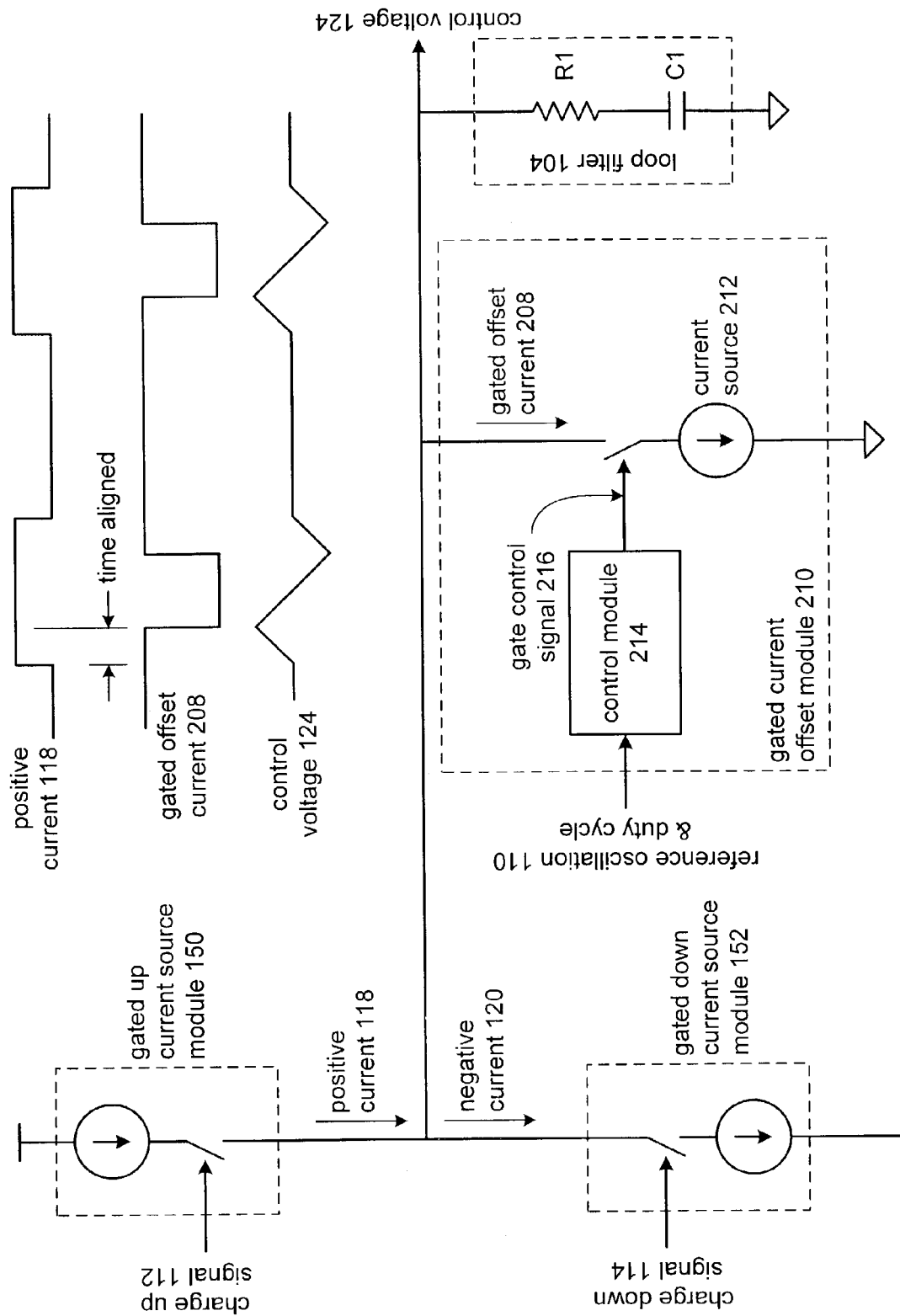
FIG. 12 is a schematic block diagram further illustrating components of the local oscillation module of FIG. 11.
Figure 13:
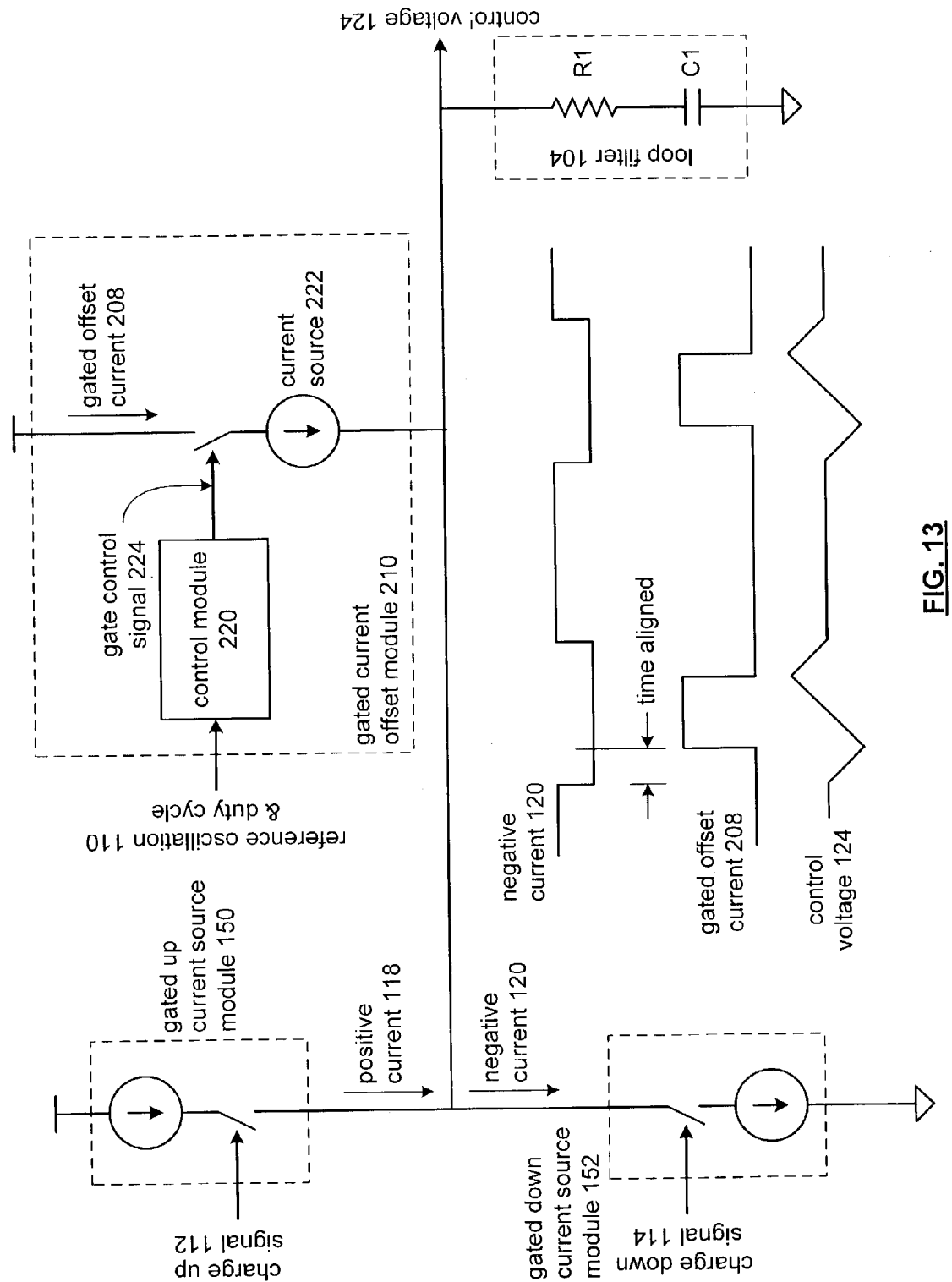
FIG. 13 is a schematic block diagram further illustrating an alternate embodiment of the components of the local oscillation module of FIG. 11.

FIG. 12 illustrates the charge pump 200, gated current offset module 210 and loop filter 104 of FIG. 13 in greater detail. The charge pump circuit 200 includes the gated-up current source module 150 and the gated-down current source module 152. Accordingly, the gated-up current source module 150 produces the positive current 118 in response to the charge-up signal 112. The gated-down current source module 152 produces the negative current 120 based on the charge down signal 114. The gated-down current source module 152 and the gated-up current source module 150 are either both on or both off to produce the zero current 206 in response to the off signal.

The gated current offset module 210 includes a control module 214, a switch and a current source 212, which may include resistor R2 and control module 155 or 157 as shown in FIGS. 4, 5, or 6. The switch is activated based on a gate control signal 216 that is produced by the control module 214. The control module 214 produces the gated control signal 216 based on the reference oscillation 110 and its corresponding duty cycle. As graphically illustrated in FIG. 14, the positive current 118 is activated for a particular duration. The period of the positive current 118 corresponds to the period of the reference oscillation 110. Accordingly, the gated offset current 208, which corresponds to the duty cycle of the reference oscillation 110, is activated to sink current from the loop filter 104 during the time when the positive current 118 is being provided. As shown, the gated offset current 208 is time aligned with respect to the positive current 118. As such, the ripple on the control voltage 124 is reduced in comparison to the constant offset current sources. By reducing the ripple on the control voltage 124, the magnitude of the reference feed-through noise, or reference spurs, is reduced.

FIG. 13 illustrates an alternate embodiment of the gated offset current module 210 of the local oscillation module 74 of FIG. 13. In this embodiment, the charge pump circuit 200 includes the gated-up current source module 150 and the gated-down current source module 152 and operate as previously discussed. Similarly, loop filter 104 includes resistor R1 and C1 and operates as previously discussed.

The gated current offset module 210 includes current source 222 and control module 220. The control module 220 produces a gate control signal 224 that closes a gate, which enables the current source 222, which may include resistor R2 and control module 155 or 157 as shown in FIGS. 4, 5, or 6, to produce the gated offset current 208. The control module 220 produces the gated control signal 224 based on the reference oscillation 110 and its corresponding duty cycle.

A graphical representation of the negative current 120 is illustrated to transition low and high corresponding to the activation and deactivation of the gated down current source module 152. The gated offset current 208 is shown to be time aligned with the negative current 120 and to be activated during a portion of the duration of the negative current 120. This minimizes the ripple on the control voltage 124.

The preceding discussion has presented a method and apparatus for linearizing the operation of a fractional-N synthesizer and/or other types of oscillation synthesizers. By offsetting the operation of a charge pump into its linear regions, the overall performance of the fractional-N synthesizer and/or oscillation synthesizer is improved. As one of average skill in the art will appreciate, other embodiments may be derived from the teaching of the present invention, without deviating from the scope of the claims.

What is claimed is:

1. A linearized fractional-N synthesizer comprises:

phase and frequency detection module operably coupled to receive a reference oscillation and to produce a charge up signal, a charge down signal, or an off signal based on at least one of a phase difference and a frequency difference between the reference oscillation and a feedback oscillation;

charge pump circuit operably coupled, to produce a positive current when the charge up signal is received, a negative current when the charge down signal is received, and a non-zero offset current when the off signal is received, the charge pump circuit to produce the non-zero offset current when the off signal is received and to combine the positive current or the negative current with the non-zero offset current when the charge up signal or the charge down signal is respectively received, the non-zero offset current to have a substantially constant non-zero current value to establish an offset at an output node of the charge pump circuit to shift a response of the charge pump circuit to operate the charge pump circuit in a linear region, wherein the charge pump circuit includes:

resistor operably coupled between the output node of the charge pump circuit and a supply or supply return node to provide the non-zero offset current; and control module operably coupled to maintain the substantially constant non-zero current value for the non-zero offset current;

loop filter operably coupled to produce a control voltage at the output of the charge pump circuit based on at least some of: the positive current, the negative current, and the non-zero offset current;

voltage controlled oscillator to produce an output oscillation based on the control voltage; and fractional-N divider module operably coupled to divided the output oscillation by a fractional N value to produce the feedback oscillation.

2. The linearized fractional-N synthesizer of claim 1, wherein the control module further comprises:

resistor calibration module operable to adjust resistance of the resistor to set the substantially constant non-zero offset current through the resistor.

3. The linearized fractional-N synthesizer of claim 1, wherein the control module further comprises:

VCO calibration module operable to set the control voltage for a steady state condition such that the substantially constant non-zero current flows through the resistor to provide the non-zero offset current.

4. The linearized fractional-N synthesizer of claim 3, wherein the VCO calibration module further functions to:

select one of a plurality of frequency to voltage curves to set the control voltage for the steady state condition to establish the non-zero current through the resistor based on the control voltage.

5. A fractional-N synthesizer comprises:
  phase and frequency detection module operably coupled to receive a reference oscillation and to produce a charge up signal, a charge down signal, or an off signal based on at least one of a phase difference and a frequency difference between a reference oscillation and a feedback oscillation;
  charge pump circuit to produce a positive current in response to the charge up signal, a negative current in response to the charge down signal, and zero current in response to the off signal;
  gated current offset module operably coupled to cyclically provide a gated offset current based on the reference oscillation, the gated offset current to be cyclically combined with the positive current or the negative current, but respectively provide an opposite current to reduce ripple effect of the positive or negative current on a control voltage, wherein the gated current offset module includes:
    resistor operably coupled between an output node of the charge pump circuit and a supply or supply return node;
    switching device operably coupled to the resistor, wherein the switching device cyclically couples the resistor to produce the gated offset current; and
    control module operably coupled to maintain a substantially constant current value for the gated offset current when the gated offset current is gated on by the switching device;
  loop filter operably coupled to filter at least some of: the positive current, the negative current, the zero current, and the gated offset current to produce the control voltage;
  voltage controlled oscillator to produce an output oscillation based on the control voltage; and
  fractional-N divider module operably coupled to divided the output oscillation by a fractional N value to produce the feedback oscillation.

6. The linearized fractional-N synthesizer of claim 5, wherein the control module further comprises:
  resistor calibration module operable to adjust resistance of the resistor to set the substantially constant current through the resistor.

7. The linearized fractional-N synthesizer of claim 5, wherein the control module further comprises:
  VCO calibration module operable to set the control voltage for a steady state condition such that a substantially constant current flows through the resistor to provide the gated offset current.

8. The linearized fractional-N synthesizer of claim 7, wherein the VCO calibration module further functions to:
  select one of a plurality of frequency to voltage curves to set the control voltage for the steady state condition to establish the gated offset current through the resistor based on the control voltage.

9. A radio comprising:
  transmitter section operably coupled to convert outbound data into outbound radio frequency (RF) signals based on a transmitter local oscillation;
  receiver section operably coupled to convert inbound RF signals into inbound data based on a receiver local oscillation; and
  local oscillator operably coupled to produce the transmitter local oscillation and the receiver local oscillation, wherein the local oscillator includes:
    phase and frequency detection module operably coupled to receive a reference oscillation and to produce a charge up signal, a charge down signal, or an off signal based on at least one of a phase difference and a frequency difference between a reference oscillation and a feedback oscillation;
    charge pump circuit operably coupled to produce a positive current when the charge up signal is received, a negative current when the charge down signal is received, and a non-zero offset current when the off signal is received, the charge pump circuit to produce the non-zero offset current when the off signal is received and to combine the positive current or the negative current with the non-zero offset current when the charge up signal or the charge down signal is respectively received, the non-zero offset current to have a substantially constant non-zero current value to establish an offset at an output node of the charge pump circuit to shift a response of the charge pump circuit to operate the charge pump circuit in a linear region, wherein the charge pump circuit includes:
      resistor operably coupled between the output node of the charge pump circuit and a supply or supply return node to provide the non-zero offset current; and
      control module operably coupled to maintain the substantially constant non-zero current value for the non-zero offset current;
    loop filter operably coupled to produce a control voltage at the output of the charge pump circuit based on at least some of: the positive current, the negative current, and the non-zero offset current;
    voltage controlled oscillator to produce an output oscillation based on the control voltage; and
    fractional-N divider module operably coupled to divided the output oscillation by a fractional N value to produce the feedback oscillation.

10. The radio of claim 9, wherein the control module further comprises:
  resistor calibration module operable to adjust resistance of the resistor to set the substantially constant non-zero offset current through the resistor.

11. The radio of claim 9, wherein the control module further comprises:
  VCO calibration module operable to set the control voltage for a steady state condition such that the substantially constant non-zero current flows through the resistor to provide the non-zero offset current.

12. The radio of claim 11, wherein the VCO calibration module further functions to:
  select one of a plurality of frequency to voltage curves to set the control voltage for the steady state condition to establish the non-zero current through the resistor based on the control voltage.

13. A radio comprising:
  transmitter section operably coupled to convert outbound data into outbound radio frequency (RF) signals based on a transmitter local oscillation;
  receiver section operably coupled to convert inbound RF signals into inbound data based on a receiver local oscillation; and
  local oscillator operably coupled to produce the transmitter local oscillation and the receiver local oscillation, wherein the local oscillator includes:
    phase and frequency detection module operably coupled to receive a reference oscillation and to produce a charge up signal, a charge down signal, or an off signal based on at least one of a phase difference and a frequency difference between a reference oscillation and a feedback oscillation;

charge pump circuit to produce a positive current in response to the charge up signal, a negative current in response to the charge down signal, and zero current in response to the off signal;

gated current offset module operably coupled to cyclically provide a gated offset current based on the reference oscillation, the gated offset current to be cyclically combined with the positive current or the negative current, but respectively provide an opposite current to reduce ripple effect of the positive or negative current on a control voltage, wherein the gated current offset module includes:

resistor operably coupled between an output node of the charge pump circuit and a supply or supply return node;

switching device operably coupled to the resistor, wherein the switching device cyclically couples the resistor to produce the gated offset current; and control module operably coupled to maintain a substantially constant value for the gated offset current when the gated offset current is gated on by the switching device;

loop filter operably coupled to filter at least some of: the positive current, the negative current, the zero current, and the gated offset current to produce the control voltage;

voltage controlled oscillator to produce an output oscillation based on the control voltage; and fractional-N divider module operably coupled to divided the output oscillation by a fractional N value to produce the feedback oscillation.

14. The radio of claim 13, wherein the control module further comprises:

resistor calibration module operable to adjust resistance of the resistor to set the substantially constant current through the resistor.

15. The radio of claim 13, wherein the control module further comprises:

VCO calibration module operable to set the control voltage for a steady state condition such that a substantially constant current flows through the resistor to provide the gated offset current.

16. The radio of claim 15, wherein the VCO calibration module further functions to:

select one of a plurality of frequency to voltage curves to set the control voltage for the steady state condition to establish the gated offset current through the resistor based on the control voltage.

* * * * *

UNITED STATES PATENT AND TRADEMARK OFFICE
CERTIFICATE OF CORRECTION

PATENT NO. : 7,171,183 B2 Page 1 of 1
APPLICATION NO. : 10/407097
DATED : January 30, 2007
INVENTOR(S) : Hung-Ming Chien It is certified that error appears in the above-identified patent and that said Letters Patent is hereby corrected as shown below:

Column 12, line 20, in Claim 1: remove the comma after "coupled"

Signed and Sealed this

Thirtieth Day of December, 2008

JON W. DUDAS
*Director of the United States Patent and Trademark Office*

UNITED STATES PATENT AND TRADEMARK OFFICE
CERTIFICATE OF CORRECTION

PATENT NO. : 7,171,183 B2 Page 1 of 1
APPLICATION NO. : 10/407097
DATED : January 30, 2007
INVENTOR(S) : Hung-Ming Ed Chien It is certified that error appears in the above-identified patent and that said Letters Patent is hereby corrected as shown below:

Column 1, lines 5 through 14 should read:

The present application is a continuation in part of and claims priority under 35 U.S.C. § 120 to the following applications, each of which is incorporated herein for all purposes:
    (1) LINEARIZED FRACTIONAL-N SYNTHESIZER HAVING A GATED OFFSET having an application Ser. No. of 10/170,849 and a filing date of Jun. 12, 2002; and
    (2) ) LINEARIZED FRACTIONAL-N SYNTHESIZER WITH FIXED CHARGE PUMP OFFSET having an application Ser. No. of 10/167,811 and a filing date of Jun. 12, 2002.

Signed and Sealed this

Twenty-ninth Day of June, 2010

David J. Kappos
*Director of the United States Patent and Trademark Office*